United States Patent
Fushie et al.

(10) Patent No.: US 9,978,670 B2
(45) Date of Patent: May 22, 2018

(54) SEMICONDUCTOR MODULE AND SEMICONDUCTOR DRIVING DEVICE

(71) Applicant: Mitsubishi Electric Corporation, Tokyo (JP)

(72) Inventors: Shunsuke Fushie, Tokyo (JP); Yoshihito Asao, Tokyo (JP); Yu Kawano, Tokyo (JP); Akihiko Mori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 15/503,438

(22) PCT Filed: Nov. 27, 2014

(86) PCT No.: PCT/JP2014/081315
§ 371 (c)(1),
(2) Date: Feb. 13, 2017

(87) PCT Pub. No.: WO2016/084180
PCT Pub. Date: Jun. 2, 2016

(65) Prior Publication Data
US 2017/0236774 A1    Aug. 17, 2017

(51) Int. Cl.
*H01L 23/495* (2006.01)
*H01L 23/28* (2006.01)
(Continued)

(52) U.S. Cl.
CPC ........ *H01L 23/49568* (2013.01); *H01L 23/28* (2013.01); *H01L 23/3672* (2013.01);
(Continued)

(58) Field of Classification Search
CPC ........... H01L 23/49568; H01L 23/3672; H01L 23/49537; H01L 23/49575; H01L 23/50;
(Continued)

(56) References Cited

U.S. PATENT DOCUMENTS

2001/0033477 A1    10/2001    Inoue et al.
2002/0109211 A1*   8/2002    Shinohara ........... H01L 23/4334
                                                                            257/666
(Continued)

FOREIGN PATENT DOCUMENTS

JP    2002-083915 A    3/2002
JP    2004-296663 A    10/2004
(Continued)

OTHER PUBLICATIONS

International Search Report for application No. PCT/JP2014/081315 dated Feb. 3, 2015.
(Continued)

*Primary Examiner* — Fei Fei Yeung Lopez
(74) *Attorney, Agent, or Firm* — Sughrue Mion, PLLC; Richard C. Turner

(57) ABSTRACT

A semiconductor module forming a semiconductor device includes lead frames in which switching elements are mounted on the side of upper surfaces and heat radiation surfaces are formed on the side of lower surfaces, and bus bars disposed on the lead frames and connecting between plural switching elements. The heat radiation surfaces of the lead frames are arranged on one plane and upper surfaces of flat surface portions of the bus bars are arranged on one plane, therefore, a layout property on the heat radiation surfaces or the upper surfaces the flat surface portions is good, which facilitates creation of a heat radiation structure and so on.

16 Claims, 14 Drawing Sheets

(51) Int. Cl.
  *H01L 23/50* (2006.01)
  *H01L 23/367* (2006.01)
  *H01L 23/498* (2006.01)
  *H01L 23/528* (2006.01)

(52) U.S. Cl.
  CPC .. *H01L 23/49537* (2013.01); *H01L 23/49551* (2013.01); *H01L 23/49575* (2013.01); *H01L 23/49586* (2013.01); *H01L 23/49861* (2013.01); *H01L 23/50* (2013.01); *H01L 23/5283* (2013.01); *H01L 23/5286* (2013.01); *H01L 23/4952* (2013.01); *H01L 23/49524* (2013.01); *H01L 2224/0603* (2013.01); *H01L 2224/37147* (2013.01); *H01L 2224/40137* (2013.01); *H01L 2224/40245* (2013.01); *H01L 2224/48247* (2013.01); *H01L 2924/0002* (2013.01); *H01L 2924/181* (2013.01); *H01L 2924/19107* (2013.01)

(58) Field of Classification Search
  CPC .. H01L 23/5283; H01L 23/5286; H01L 23/28
  See application file for complete search history.

(56) References Cited

U.S. PATENT DOCUMENTS

| | | |
|---|---|---|
| 2003/0090873 A1 | 5/2003 | Ohkouchi |
| 2003/0128518 A1* | 7/2003 | Gaynes ............... H01L 23/3675 361/704 |
| 2004/0144996 A1 | 7/2004 | Inoue |
| 2005/0040515 A1 | 2/2005 | Inoue et al. |
| 2006/0120047 A1 | 6/2006 | Inoue |
| 2006/0232939 A1 | 10/2006 | Inoue |
| 2007/0076355 A1* | 4/2007 | Oohama ............... H01L 25/117 361/676 |
| 2008/0012045 A1* | 1/2008 | Muto ................... H01L 21/565 257/177 |
| 2009/0224398 A1 | 9/2009 | Noritake et al. |
| 2009/0294960 A1* | 12/2009 | Yoshida ................. H01L 23/50 257/737 |
| 2011/0058342 A1 | 3/2011 | Kawakita et al. |
| 2011/0089558 A1 | 4/2011 | Muto et al. |
| 2011/0089765 A1* | 4/2011 | Iwata .................... H02M 7/49 307/82 |
| 2012/0306328 A1 | 12/2012 | Fujita |
| 2012/0314372 A1 | 12/2012 | Hauenstein |
| 2014/0063744 A1 | 3/2014 | Lopez et al. |
| 2014/0273344 A1* | 9/2014 | Terrill ............... H01L 23/49575 438/107 |
| 2015/0270199 A1 | 9/2015 | Sunaga et al. |

FOREIGN PATENT DOCUMENTS

| | | |
|---|---|---|
| JP | 2008-021796 A | 1/2008 |
| JP | 2009-302526 A | 12/2009 |
| JP | 2011-060927 A | 3/2011 |
| JP | 2011-086889 A | 4/2011 |
| JP | 4748173 B2 | 8/2011 |
| JP | 2012-209598 A | 10/2012 |
| JP | 2013-058733 A | 3/2013 |
| JP | 2013-251500 A | 12/2013 |
| JP | 5397417 B2 | 1/2014 |
| WO | 2014/039658 A1 | 3/2014 |
| WO | 2014/068937 A1 | 5/2014 |

OTHER PUBLICATIONS

Communication dated Feb. 27, 2018, from the Japanese Patent Office in counterpart application No. 2016-561153.

\* cited by examiner

SEMICONDUCTOR MODULE AND SEMICONDUCTOR DRIVING DEVICE

This is a National Stage of International Application No. PCT/JP2014/081315 filed Nov. 27, 2014, the contents of all of which are incorporated herein by reference in their entirety.

TECHNICAL FIELD

The present invention relates to a semiconductor module and a semiconductor driving device using the semiconductor module.

BACKGROUND ART

In recent years, size reduction and high density mounting are making progress in a semiconductor module including power semiconductor devices such as an IGBT (Insulated Gate Bipolar Transistor) and a power MOSFET, and power generation density thereof is increased, therefore, a semiconductor package with excellent heat radiation property and layout property is required.

For example, a technique in which one face of a semiconductor module is pressed onto a heat sink to radiate heat is disclosed in a related-art semiconductor drive device (for example, refer to Patent Literature 1).

Also in a related-art semiconductor drive device (a semiconductor module in Patent Literature 2), there is a technique in which the semiconductor module (a semiconductor device in the Literature) and a pair of heat radiation plates disposed in thermal contact with both principal surfaces of the semiconductor module are integrally molded with a molding resin, metal plates are disposed on outer surfaces of the heat radiation plates through insulators, and a cooler is allowed to contact on the metal plates to radiate heat (for example, refer to Patent Literature 2).

CITATION LIST

Patent Literature

Patent Literature 1: Japanese Patent No. 5397417
Patent Literature 2: Japanese Patent No. 4748173

SUMMARY OF INVENTION

Technical Problem

However, in the semiconductor drive device disclosed in Patent Literature 1, heat is radiated only from one face of the semiconductor module and there is a limitation in improving the heat radiation property, and the heat radiation property and the layout property on the other face side have not been considered. A wiring structure of connecting between switching elements inside the semiconductor module or a wiring structure of connection between the switching element and a conductive region inside the semiconductor module which contribute to the heat radiation property and the layout property have not been described.

In the semiconductor drive device disclosed in Patent Literature 2, the reduction of heat resistance is intended by radiating heat from both principal surfaces of the semiconductor module, however, wiring structures of connecting between switching elements or between the switching element and the conductive region inside the semiconductor module have not been described. Accordingly, the module size may be increased and the imbalance of heat resistance between respective switching elements may occur.

The present invention has been made for solving the above problems, and an object thereof is to improve the heat radiation property or the layout property of a semiconductor module or a semiconductor drive device by devising the wiring structure of connecting between switching elements or between the switching element and a conductive region inside the semiconductor module.

Solution to Problem

A semiconductor module according to an embodiment of the present invention includes switching elements, lead frames in which the switching elements are mounted on the side of upper surfaces and heat radiation surfaces are formed on the side of lower surfaces, bus bars disposed on the lead frames, connecting between plural switching elements or between the lead frames and the switching elements and having flat surface portions on upper surfaces and a sealing resin for sealing the lead frames and the switching elements except heat radiation surfaces of the lead frames, in which the heat radiation surfaces of the lead frames are arranged in one plane, and the switching elements are arranged between the heat radiation surfaces of the lead frames and upper surfaces of the flat surface portions of the bus bars.

A semiconductor drive device according to an embodiment of the present invention includes the semiconductor modules and a heat sink contacting heat radiation surfaces of the lead frames included in the semiconductor modules while keeping an insulation property.

A semiconductor drive device according to an embodiment of the present invention includes further switching elements, lead frames in which the switching elements are mounted on the side of upper surfaces and heat radiation surfaces are formed on the side of lower surfaces, bus bars disposed on the lead frames, connecting between plural switching elements or between the lead frames and the switching elements and having flat surface portions on upper surfaces, and a sealing resin disposed between two-layers of lead frames arranged so as to face each other so that heat radiation surfaces of the lead frames are positioned on the outer layer side, which seals the lead frames, the switching elements and the bus bars except the heat radiation surfaces of the lead frames.

Advantageous Effects of Invention

In the semiconductor module according to the present invention, the structure in which the switching elements as heat generators are interposed between the heat radiation surfaces on the side of lower surfaces of lead frames and upper surfaces of the flat surface portions of the bus bars can be obtained. As the upper surfaces of the flat surface portions of the bus bars are flat, an advantage that the layout property is good at the time of providing structures on the upper surfaces can be obtained. Moreover, the upper surfaces of the flat surface portions of the bus bars are used as heat radiation surfaces to be contacted by the heat sink, thereby radiating heat from two faces, which can improve the heat radiation property.

In the semiconductor drive device according to the present invention, one plane of the heat sink can be disposed on heat radiation surfaces on the side of lower surfaces of the lead frames, which can improve the layout property and the heat radiation property.

Also in the semiconductor module according to the present invention, both faces of the semiconductor module can be formed by two layers of lead frames, two faces of heat radiation surfaces can be obtained.

Objects, characteristics, viewpoints and advantages of the invention other than the above will be further clarified based on the following detailed description of the present invention to be made with reference to the drawings.

DESCRIPTION OF EMBODIMENTS

Embodiment 1

Hereinafter, a semiconductor drive device including a semiconductor module (power module) according to Embodiment 1 of the present invention will be explained with reference to FIG. 1 to FIG. 6. The same symbols are given to the same or corresponding portions in respective drawings in the explanation. In Embodiment 1, explanation will be made by citing an electric power steering device as an example of the semiconductor drive device. Here, a structure in which a heat sink is added to the semiconductor module is referred to as the semiconductor drive device.

Figure 1:
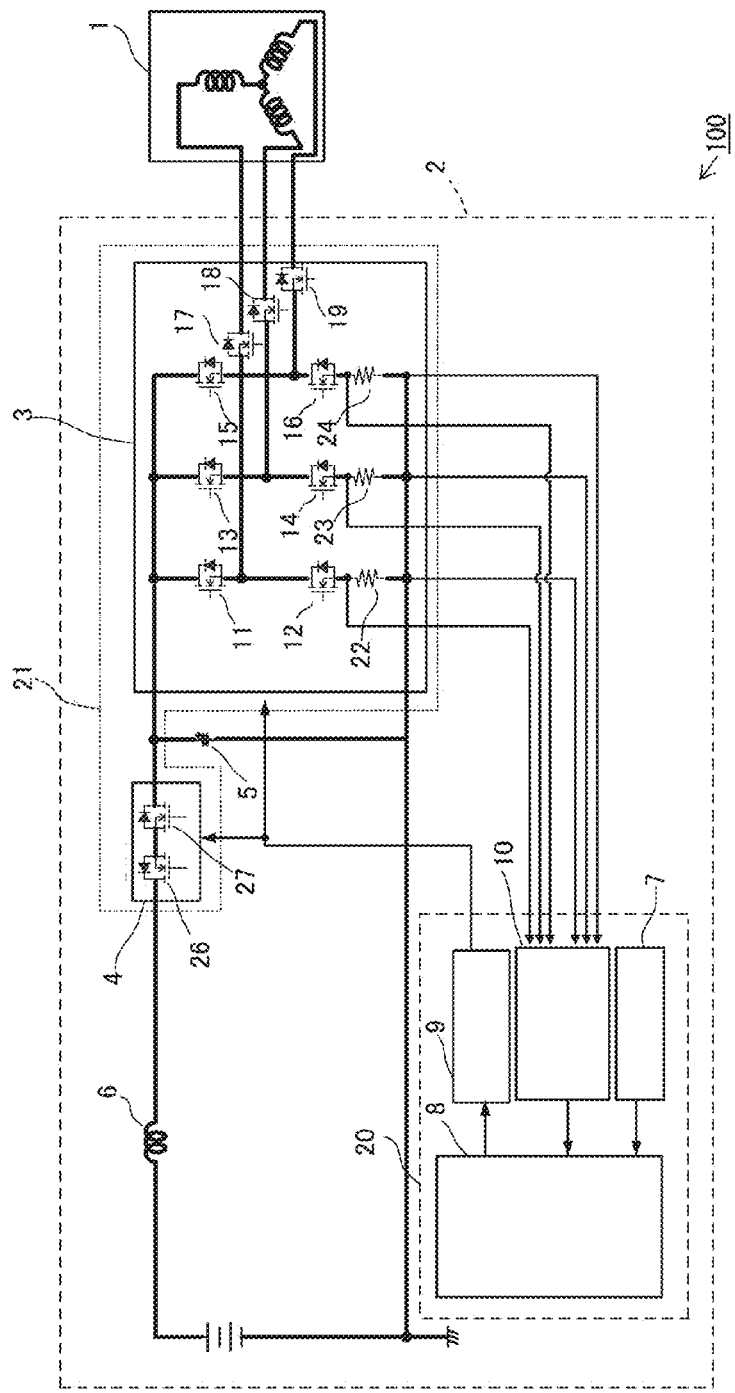
FIG. 1 is a circuit diagram showing a schematic configuration of a semiconductor drive device according to Embodiment 1 of the present invention.

FIG. 1 is a circuit diagram showing a schematic configuration of a semiconductor drive device 100 as an electric power steering device mounted on a vehicle. The semiconductor drive device 100 is used by being mounted on the vehicle and so on. The semiconductor drive device 100 includes a motor 1 and a controller 2 (control unit) as components, and the motor 1 and the controller 2 are integrally formed.

The controller 2 includes a control circuit unit 20 and a power circuit unit 21. The control circuit unit 20 includes a microcomputer 8, and the power circuit unit 21 includes a power supply relay 4 which connects/cuts a power supply line and an inverter 3.

Outputs from a battery, a vehicle-speed sensor, a torque sensor and so on are inputted to the control circuit unit 20, and a steering-wheel assisting amount calculated by the microcomputer 8 is outputted to the inverter 3 through a pre-driver 9. A rotation sensor I/F transmitting a signal from a rotation sensor 7 which detects rotation of the motor 1 and a current monitor I/F 10 measuring current to be supplied to the motor 1 are also included.

The controller 2 includes a choke coil 6, and a smoothing capacitor 5 which receive the power of the battery and suppress noise. The choke coil 6 and the smoothing capacitor 5 configure a power supply unit with the power supply relay 4, and the power supply unit supplies power to the inverter 3.

The inverter 3 includes three pairs of, six switching elements (semiconductor devices) in total of upper and lower arms so as to correspond to three-phase windings of the motor 1 (these switching elements are represented by symbols 11, 12, 13, 14, 15 and 16. The details will be described). The switching elements (semiconductor devices) functioning as relays which can connect and cut the power supply to the motor 1 are arranged in respective phases (these switching elements are represented by symbols 17, 18 and 19. The details will be described). Generally, as these switching elements 11 to 19 exist so as to correspond to respective windings, they are referred to with "u", "v" and "w".

Moreover, terminals for controlling respective switching elements are provided inside the controller 2, which are connected to the microcomputer 8 respectively through the pre-driver 9. Furthermore, there are three terminals for monitoring voltages among switching elements of the upper and lower arms and upstream monitor terminals of shunt resistors for detecting current 22, 23 and 24. Information from these terminals is transmitted to the microcomputer 8 through the current monitor I/F 10. Additionally, respective phase winding terminals of the motor 1 also exist in the device.

The inverter 3 is configured by including three semiconductor modules which are a U-phase semiconductor module including plural switching elements 11, 12 and 17, a V-phase semiconductor module including switching elements 13, 14 and 18 and a W-phase semiconductor module including switching elements 15, 16 and 19. As the semiconductor module includes plural switching elements, plural circuits for connecting respective components are also included, and a great number of terminals exist. As there are many wirings for supplying power to the motor 1, it is necessary to improve the heat radiation property and the improvement of the configuration of the semiconductor module is an important point contributing to the scale, quality, costs and so on of the device.

Figure 2:
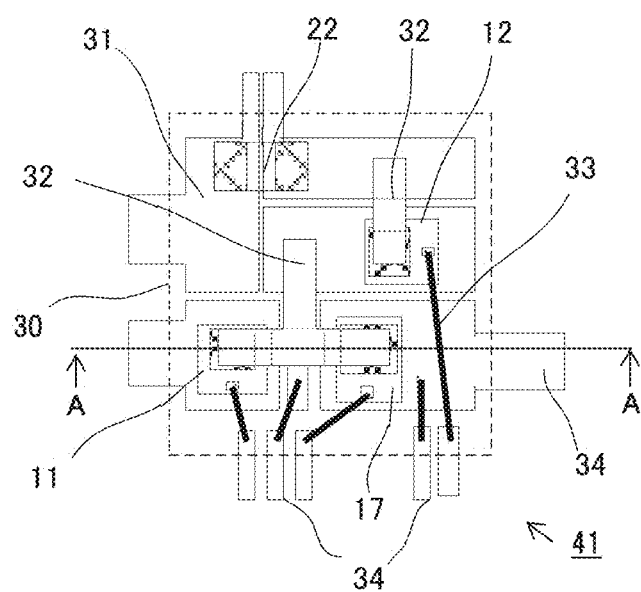
FIG. 2 is a plan view showing a semifinished state of a semiconductor module included in the semiconductor drive device according to Embodiment 1.

Next, a U-phase semiconductor module 41 is cited as an example in FIG. 2, and the configuration of the semiconductor module (power module) will be explained. FIG. 2 is a plan view showing a semifinished state of the semiconductor module 41, which is a perspective view showing a relevant part. The semiconductor module 41 is, for example, a component for driving the U-phase of the inverter 3, having a configuration in which the switching element 11 as a U-phase upper FET, the switching element 12 as a U-phase lower FET and the switching element 17 as a U-phase motor relay FET, the shunt resistor 22 and bus bars 32 (inner leads) are mounted on lead frames 31. Then, element forming regions of the lead frames 31 are molded with a sealing resin 30 except heat radiation surfaces of the lead frames 31. The V-phase semiconductor module and the W-phase semiconductor module also have the same configuration. Hereinafter, respective components will be explained in detail.

The lead frames 31 are formed by using a copper-based or iron-based alloy material, which are manufactured by performing pressing, etching processing or cutting processing to a piece of metal plate material. As shown in FIG. 2, plural lead frames 31 are put around over one semiconductor module 41 without overlapping one another. Lower surfaces of the lead frames 31 are heat radiation surfaces, and these heat radiation surfaces are arranged with uniform height in one plane. The pressing has an advantage that mass productivity is high, the etching processing has an advantage that the delivery time is short and the cutting processing has an advantage that the cost is low.

The lower surfaces of the lead frames 31 are used as the heat radiation surfaces as described above. On upper surfaces thereof, spaces of connection pads for connecting wirings and die pads for arranging semiconductor chips (chips on which the switching elements are formed) are provided. On the die pads of the lead frames 31 of the semiconductor module 41, for example, three switching elements 11, 12 and 17 which are U-phase FET are mounted as semiconductor chips as shown in FIG. 2. The bus bars 32 formed of the copper-based or iron-based material connect between plural switching elements or between the switching element and a connection region of the lead frame 31 by bridging over the lead frames 31. Furthermore, a large number of terminals are extended to outer directions of the semiconductor module 41 as external terminals 34. The external terminals 34 and respective lead frames 31 are connected by, for example, bonding wires 33 of wire bonding.

Next, a manufacturing method of the semiconductor module 41 according to Embodiment 1 will be explained.

First, the lead frames 31 on which semiconductor devices, electronic components and the like are mounted are placed on a cavity of a molding die. At this time, positions of lead frames 31 are fixed by fixed pins or movable pins on the die, then, the molding die is sealed and a thermosetting resin such as an epoxy resin is filled in the cavity to form the sealing resin 30. After the sealing resin 30 is aged and cured, unnecessary regions are finally cut and punched, thereby completing the semiconductor module 41. The sealing resin 30 may have a structure in which, for example, an outer frame is formed by the epoxy resin, and a silicon resin is filled in the frame to thereby seal the semiconductor devices and the like.

Figure 3:
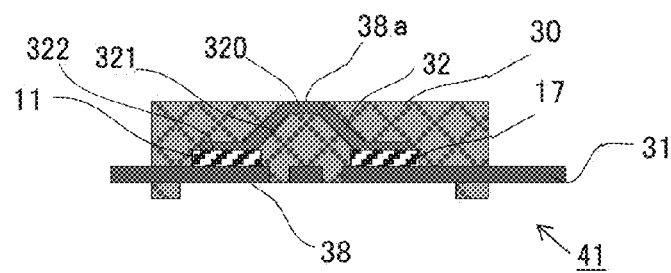
FIG. 3 is a cross-sectional view of a relevant part of the semiconductor module, showing A-A cross section of FIG. 2.

Next, a heat radiation structure of the semiconductor module 41 (power module) as the point of the present invention will be explained. FIG. 3 is a cross-sectional view of a relevant part of the semiconductor module 41 showing A-A cross section of FIG. 2. In FIG. 3, the switching elements 11, 17 are mutually connected by the bus bar 32 which is connected and arranged on elements. The switching elements 11, 17 as heat generators transmit heat to the lead frames 31 and the bus bar 32. The bus bar 32 is formed by connecting portions 322 contacting the switching elements 11, 17, inclined portions 321 extending obliquely upward from the both connecting portions 322 and a flat surface portion 320 contacting upper ends of the both inclined portions 321 and having a space on an upper surface of the module, which are continuously formed.

The switching elements 11, 17 have heat radiation surfaces 38, 38a in both upper and lower directions on the paper. The heat radiation surface 38 in the lower direction of the paper is a lower surface of the lead frame 31 to which heat from a drain surface of an FET is transmitted, and the heat radiation surface 38a in the upper direction of the paper is an upper surface of the flat surface portion 320 of the bus bar 32 which corresponds to a source portion of the FET. The heat resistance of the switching elements can be reduced by securing the heat radiation surfaces in the two directions. Heat radiation from the surface of the sealing resin 30 is smaller than heat radiation from the lead frame 31 or from the bus bar 32.

Plural lead frames 31 are arranged in one semiconductor module 41, lower surfaces of plural lead frames 31 are allowed to have the same height coordinate and arranged in one plane to thereby make the heat radiation surface 38 flat, which facilitates creation of structures onto the heat radiation surface 38. Concerning the heat radiation surface 38a of the flat surface portion 320 of the bus bar 32, the plural heat radiation surfaces 38a are allowed to have the same height coordinate and arranged in one plane, thereby improving manufacturability of the device. As the heat radiation surfaces 38, 38a are arranged in planes parallel to each other, module bonding surfaces of the two heat sinks can be also parallel to each other, therefore, the semiconductor module 41 can be stably held between the two heat sinks.

Figure 4:
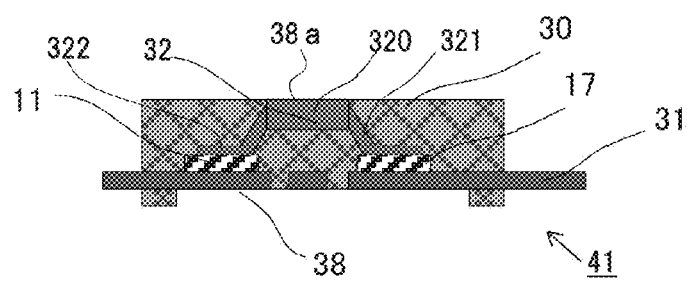
FIG. 4 is a cross-sectional view of a relevant part of the semiconductor module according to Embodiment 1.

Furthermore, as shown in a cross-sectional view of a relevant part of the semiconductor module 41 in FIG. 4, the heat radiation area of the flat surface portion 320 of the bus bar 32 as the heat radiation surface 38a is enlarged to thereby reduce the heat resistance and increase the heat capacity, which can suppress the temperature increase of the switching elements. The heat resistance can be reduced and the heat capacity can be increased also by forming the flat surface portion 320 of the bus bar 32 as thicker wiring than that of FIG. 3 as shown in FIG. 4, which can suppress the temperature increase of the switching elements. The structure in which the flat surface portion 320 of the bus bar 32 to be the heat radiation surface 38a is expanded is adopted, thereby improving the output and reducing the size of the inverter 3, which leads to the improvement of the degree of freedom in design.

Here, a modification example of the bus bar 32 will be explained. The bus bar 32 shown in FIG. 3 and FIG. 4 is formed to have a chevron shape in cross section with an upper flat surface which bridges over two elements, which contacts the switching elements 11 and so on or the lead frames 31 at portions other than the flat surface portion 320. The inclined portions 321 extend obliquely downward so as to be splayed from both ends of the flat surface portion 320 to be the heat radiation surface 38a on the upper side of the module, respectively connecting to the connecting portions 322 spreading along upper surfaces of the switching elements 11, 17. In the example shown in FIG. 3 and FIG. 4, the two inclined portions 321 are formed so that inclined angles are right-left symmetric. However, the angles of the two inclined portions 321 may be formed to be right-left asymmetric in consideration of the size of heat capacity from the connected heat generator or the area expansion of the heat radiation surface 38a.

Also in FIG. 3 and FIG. 4, the bus bar 32 has the structure in which wiring is bent at both ends of the inclined portions 321 of the bus bar 32 to obtain the flat surface portion 320 and the connecting portions 322. However, the bus bar 32 can be formed by bonding respective parts in addition to the formation by bending the wiring. In the case of bonding, it is possible to adopt a structure in which the flat surface portion 320 is formed to have a wider area and end portions of the inclined portions 321 contact the lower surface of the flat surface portion 320, which can improve the heat radiation property by expanding the area of the heat radiation surface 38a. Naturally, the inclined angle of the inclined portions 321 can be adjusted.

As described above, the shapes of the flat surface portion 320 and the inclined portion 321 may be changed depending on heat radiation characteristics of respective portions in the semiconductor module 41 to thereby keep the balance of heat capacity.

Figure 5:
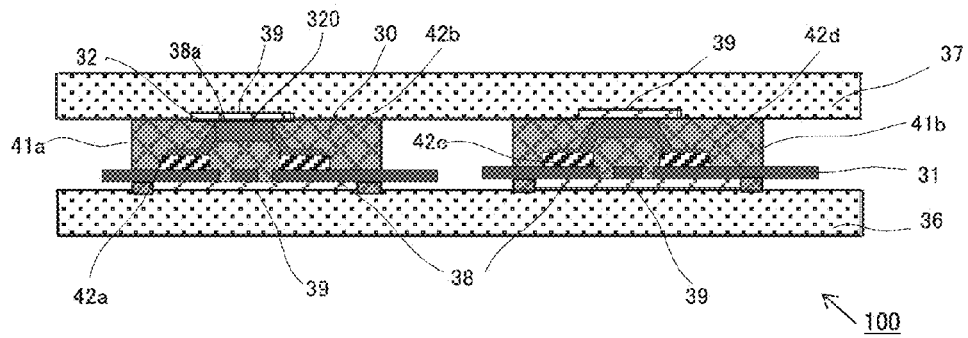
FIG. 5 is a cross-sectional view of a relevant part of the semiconductor drive device according to Embodiment 1.

Next, a method of mounting plural semiconductor modules 41a, 41b on heat sinks 36, 37 will be explained with reference to FIG. 5. FIG. 5 is a cross-sectional view of a relevant part of the semiconductor drive device 100 showing a cross-sectional structure in the case where the semiconductor modules 41a, 41b according to the present invention are mounted side by side between the heat sinks 36, 37. The heat sink 36 is arranged on the heat radiation surfaces 38 of the semiconductor modules 41a, 41b on the side of the lead frames 31, and the heat sink 37 (corresponds to a bus-bar side heat sink) is arranged on the heat radiation surfaces 38a on the side of the bus bars 32.

Here, the flat surface portions 320 to be the heat radiation surfaces 38 of the semiconductor modules 41a, 41b are required to be electrically insulated from the heat sink 37, therefore, insulation sheets 39 having an insulating property such as ceramic or silicon are interposed. The insulation sheets 39 are arranged also on lower surfaces to be the heat radiation surfaces 38 of the lead frames 31 in the same manner, which insulates between the lead frames 31 and the heat sink 36.

In the case where the two semiconductor modules 41a, 41b are arranged side by side between the heat sinks 36, 37, the layout property and the heat radiation property of the semiconductor drive device 100 can be improved by uniforming height coordinates so that the heat radiation surfaces 38, 38a are respectively arranged in one plane in the module.

Figure 6:
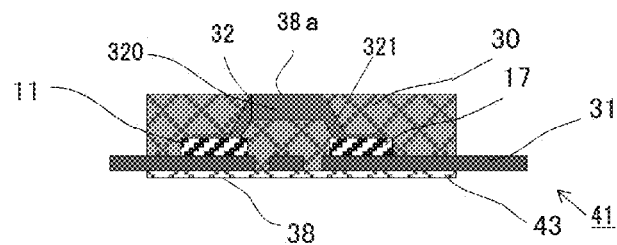
FIG. 6 is a cross-sectional view of a relevant part of the semiconductor module according to Embodiment 1.
Figure 7:
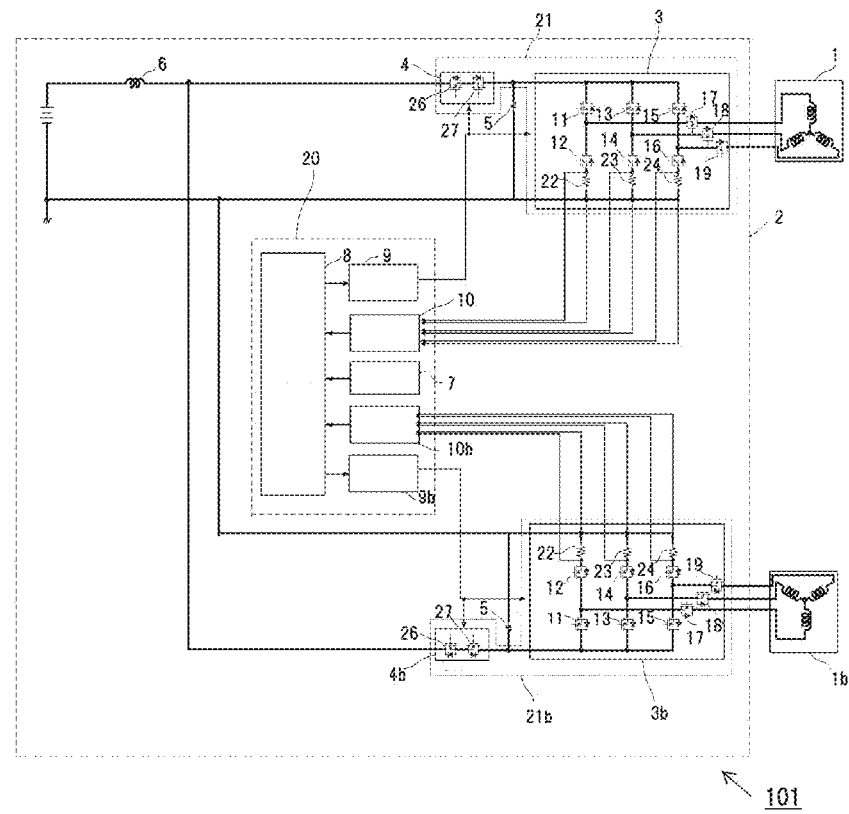
FIG. 7 is a circuit diagram showing a semiconductor drive device according to Embodiment 2.

Here, when a lower surface side of the lead frames 31 is molded with a highly heat-conductive resin 43 as shown in a cross-sectional view of a relevant part of the semiconductor module 41 in FIG. 6, the insulation sheets 39 shown in FIG. 5 are not necessary, which can simplifies an assembly process as compared with the insulation structure using the insulation sheets 39. In the highly heat-conductive resin 43, it is preferable that the thermal conductivity is 3 W/m·K or more and a distance between the lower surface of the lead frame 31 and the heat sink 36 is 200 µm or less for reducing the heat resistance. Moreover, application of grease for radiation is effective on reducing the heat resistance as the heat resistance between respective heat radiation surfaces 38, 38a and the heat sinks 36, 37 is reduced. Furthermore, when a structure in which the heat sinks 36, 37 are pressed onto the heat radiation surfaces 38, 38a of the semiconductor module 41a, 41b is adopted in the structure shown in FIG. 5, the heat resistance can be further reduced.

Embodiment 2

Next, a semiconductor module and a semiconductor drive device according to Embodiment 2 of the present invention will be explained with reference to FIG. 7 to FIG. 14. Although the structure of the semiconductor drive device 100 having one three-phase inverter system has been cited as the example in Embodiment 1, a semiconductor drive device 101 having two three-phase inverter systems will be explained in Embodiment 2. The semiconductor drive device 101 is shown as, for example, the electric power steering device. In a circuit diagram of the semiconductor drive device 101 shown in FIG. 7, motors 1, 1b respectively include stator windings, and the controller 2 includes inverters 3, 3b which can independently drive respective windings. The controller 2 controls the both so as to cooperate with each other, and continues motor driving only by a normal group when an abnormality occurs. Also in the semiconductor drive device 101, components other than the inverter 3 have also dual systems, which makes a structure for case of failure. In the semiconductor drive device 101 shown in FIG. 7, components added to the structure shown in FIG. 1 of Embodiment 1 are the motor 1b, the inverters 3b including the switching elements 11 to 19, a power circuit units 21b including a power supply relay 4b and the inverter 3b, the smoothing capacitor 5, the pre-driver 9b, a power supply monitor I/F 10b and so on in the control circuit unit 20.

Figure 8:
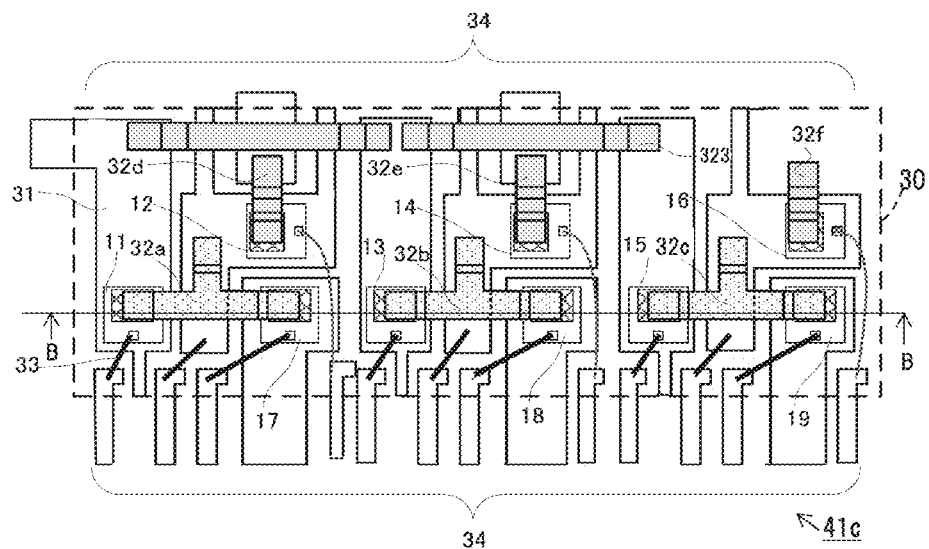
FIG. 8 is a plan view showing a semifinished state of a semiconductor module included in the semiconductor drive device according to Embodiment 2.

Here, as the components inside the semiconductor drive device 101 have dual systems, respective parts are reduced in size for suppressing the size increase of the device itself. For example, as shown by a plan view (perspective view showing a relevant part) of a semifinished product of the semiconductor drive device in FIG. 8, a semiconductor module 41c (power module) is configured as a three-phase integrated module to increase the integration degree, in which all the switching elements 11 to 19 driving the inverters 3, 3b are mounted inside one package. As shown in FIG. 8, bus bars 32a to 32f connecting between switching elements and between the switching elements and connection regions on the upper surface of the lead frame are laid out so as not to overlap one another on a plane for making heat radiation characteristics uniform in the device. As wiring for connecting between two lead frames 31, there is a bus bar 323 between lead frames. Only changed portions due to the above different points will be explained below, and explanation of the same components as the above is omitted here.

Figure 9:
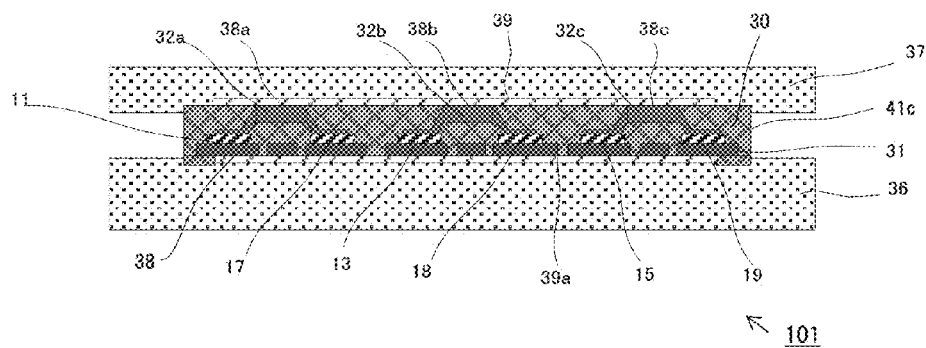
FIG. 9 is a cross-sectional view of a relevant part of the semiconductor module, showing B-B cross section of FIG. 8.

On the semiconductor module 41c according to Embodiment 2, the switching elements (11 to 19) which generate heat are mounted as shown in the plan view of FIG. 8. As shown in FIG. 9 which is a cross-sectional view of the semiconductor drive device 101 corresponding to B-B cross section of FIG. 8, respective elements are sandwiched by the heat sinks 36, 37 from upper and lower both surfaces and heat is radiated through the heat sinks 36, 37, therefore, heat radiation surfaces 38a, 38b and 38c formed by upper surfaces of the bus bars 32a, 32b and 32c are formed in the semiconductor module 41c, which contact a flat surface of the heat sink 37 while keeping the insulating property. As shown in the cross-sectional view of the bus bars 32a, 32b and 33c in FIG. 9, height coordinates of all the heat radiation surfaces 38a, 38b and 38c of Embodiment 2 are uniformed and these surfaces are arranged in one plane in the same manner as the heat radiation surface 38a shown in Embodiment 1, which facilitates the manufacture and design of film deposition, bonding and so on with respect to the upper surface side. It goes without saying that the manufacturability is simplified also in the heat radiation surface 38 on the lower surface of the lead frame 31 by adopting the structure in which all the height coordinates are uniformed in one semiconductor module 41c in the same manner as Embodiment 1.

Although the heat sinks 36, 37 has flat plate shapes with the same degree of thickness in Embodiment 1, the heat sink 36 arranged on the lower surface side of the lead frames 31 where the heat resistance between plural switching elements and the heat radiation surface 38 is reduced has a larger size than that shown in Embodiment 1 and has a larger size than the upper-side heat sink 37 in Embodiment 2. As the heat sink 36 on the side where the amount of heat to be transmitted is higher is formed thicker, the heat capacity can be increased and is regulated for preventing imbalance in temperature increase in the device. The actual size of the heat sink is determined in consideration of the heat generation amount and allowable temperature of the heat generation elements, the heat resistance between the heat generation elements and respective heat radiation surfaces and states in the outside of the heat sink.

Figure 10:
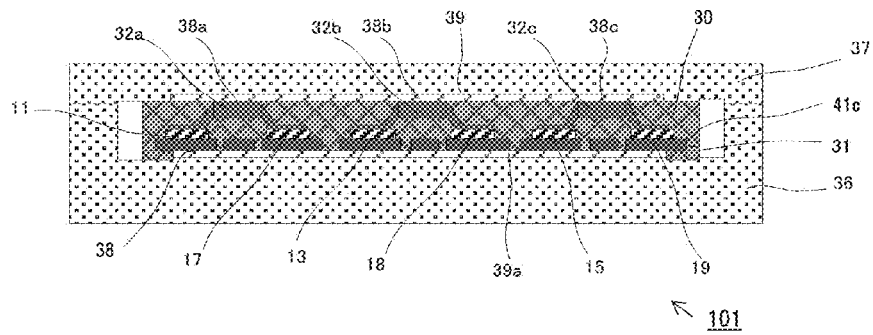
FIG. 10 is a cross-sectional view of a relevant part of the semiconductor module, showing B-B cross section of FIG. 8.

As shown in a cross-sectional view of a relevant part of the semiconductor drive device 101 in FIG. 10, it is also possible to partially deform shapes of the heat sinks 36, 37 sandwiching both surfaces of the semiconductor module 41c to thereby extend outer peripheral portions of the heat sinks 36, 37 to contact each other, which leads to further increase of the heat capacity and heat transmission. Furthermore, EMC-resistant performance can be improved by allowing the heat sinks 36, 37 to contact each other to thereby allow the both to have the same potential.

Figure 11:
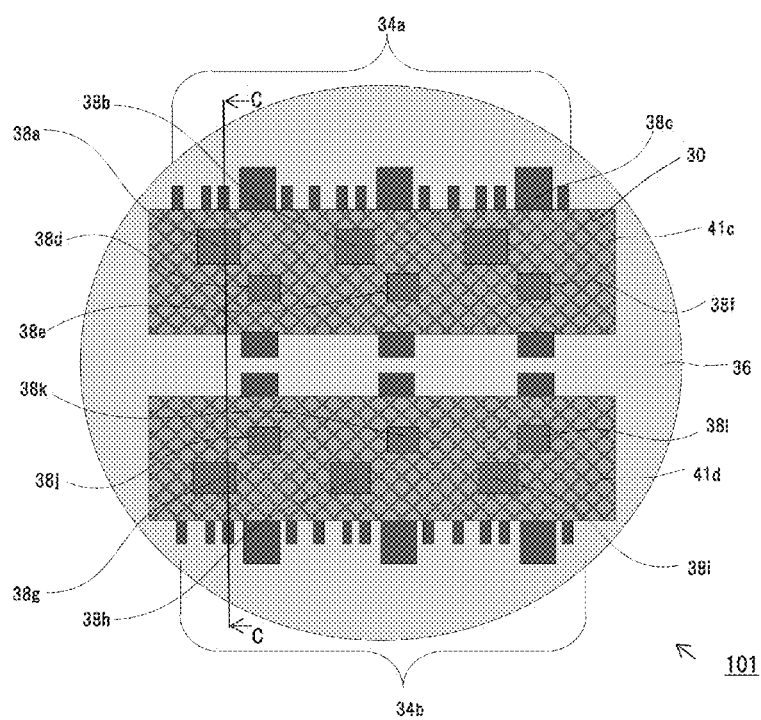
FIG. 11 is a plan view showing a relevant part of an inverter drive unit included in the semiconductor drive device according to Embodiment 2.

Next, FIG. 11 shows a plan view of an inverter drive unit of the semiconductor drive device 101 according to Embodiment 2. FIG. 11 shows a state where a semiconductor module 41d having a symmetrical structure to the semiconductor module 41c is arranged on the same heat sink 36, in which respective terminal portions 34a, 34b are arranged so as to face outward. The semiconductor modules 41c, 41d include heat radiation surfaces 38a to 38f, 38g to 38l on upper surface of the sealing resin 30, and the heights of the heat radiation surfaces 38a to 38l are common in coordinates.

Figure 12:
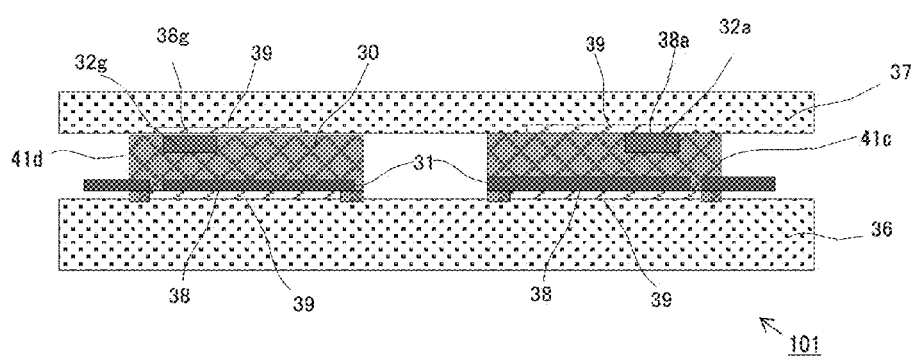
FIG. 12 is a cross-sectional view of the inverter drive unit included in the semiconductor drive device according to Embodiment 2.

Furthermore, FIG. 12 shows a cross-sectional view of the inverter drive unit extracting the heat sink portion of the semiconductor drive device 101, which corresponds to C-C cross section of FIG. 11.

Figure 13:
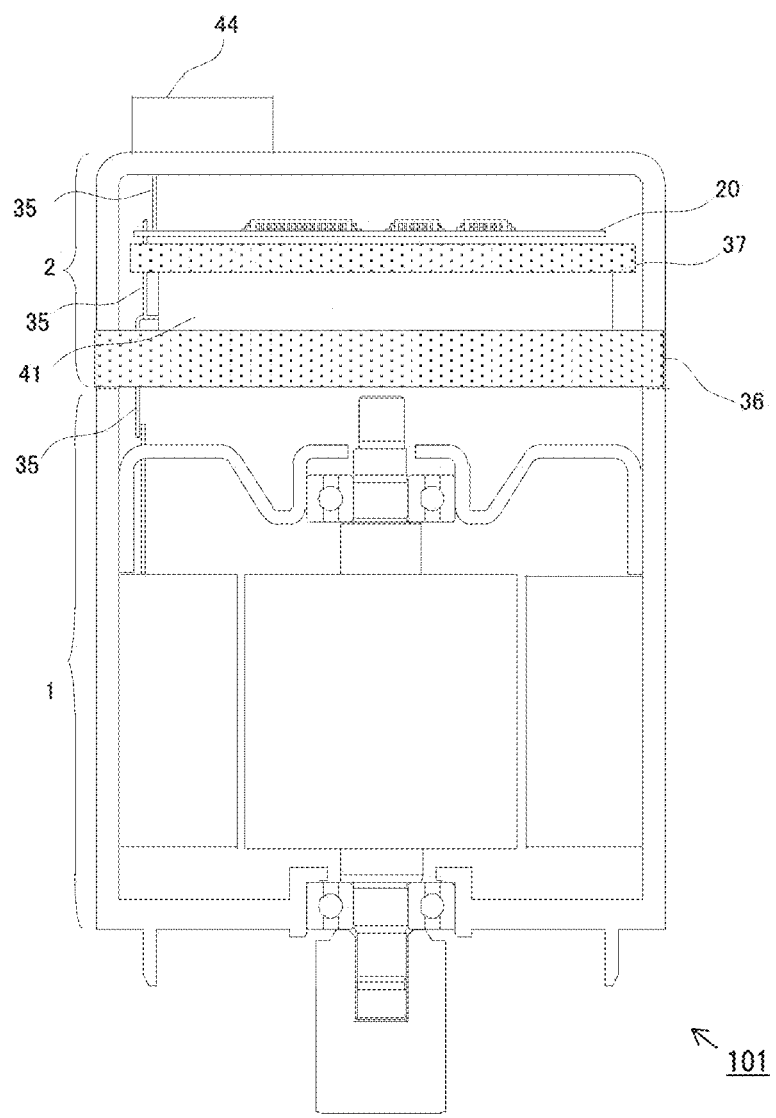
FIG. 13 is a sectional side view of the semiconductor drive device according to Embodiment 2.

FIG. 13 shows a sectional side view of the entire semiconductor drive device 101. FIG. 13 shows a state as an example where the semiconductor module 41 is arranged on the motor 1 and the control circuit unit 20 is arranged thereon in a case 44, in which respective components are connected by terminal portions 35. The semiconductor drive device 101 as the electric power steering device has a cylindrical structure, two power modules 41 (41c, 41d) are mounted vertically with respect to an axial direction of the device and the heat radiation surfaces 38 on the lower surface side of the lead frame 31 and the heat radiation surfaces 38a on the upper surface side of the flat surface portion of the bus bar 32 are respectively arranged in the same plane.

Figure 14:
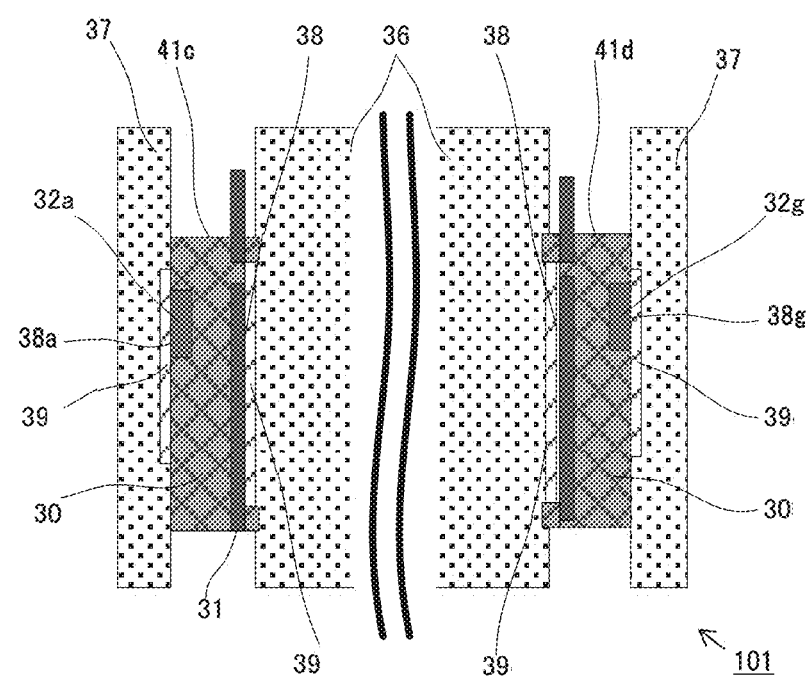
FIG. 14 is a cross-sectional view of the inverter drive unit of the semiconductor drive device according to Embodiment 2.
Figure 15:
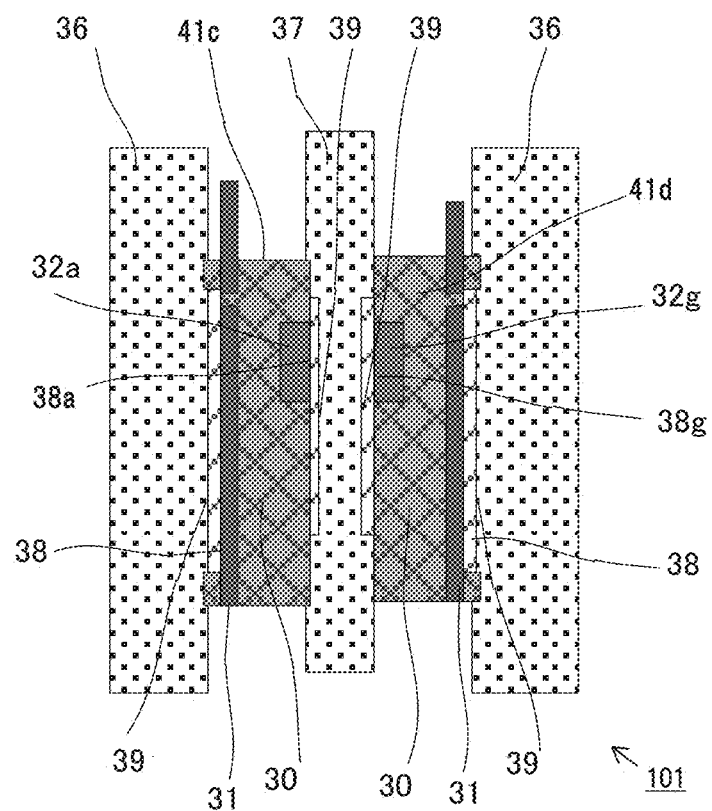
FIG. 15 is a cross-sectional view of the inverter drive unit of the semiconductor drive device according to Embodiment 2.

Here, a mounting direction of the semiconductor module 41 on the heat sinks 36, 37 is not limited to the side-by-side structure shown in FIG. 12 but a structure of vertical arrangement in which module forming surfaces of the semiconductor modules 41c, 41d face each other as shown in FIG. 14 and FIG. 15 may be adopted to thereby secure four or more heat radiation surfaces which are parallel to one another.

FIG. 14 shows a cross-sectional view of the inverter drive unit of the semiconductor drive device 101, which is a mounting example of the semiconductor modules 41c, 41d, in which the semiconductor modules 41c, 41d are respectively arranged so that the heat radiation surfaces 38 on the side of the lead frames 31 thermally contact two surfaces of one plate-shaped heat sink 36 which is vertically placed. On the heat radiation surfaces 38a on the side of the bus bars 32 of the semiconductor modules 41c, 41d, two separate heat sinks 37 are respectively arranged in the device. When the heat amounts transmitted to the two heat radiation surfaces 38, 38a on both surfaces of the module are compared, the heat amount transmitted to the heat radiation surface 38 on the side of the lead frame 31 is higher, therefore, the heat sink 36 contacting the heat radiation surface 38 uses a thick structural body having a higher heat capacity than the heat sink 37 arranged on the other surface.

As described above, the mounting direction (vertical mounting, horizontal mounting) of the module can be selected so as to correspond to the structure of the entire device. In either case, the heat radiation surface 38 on the lower surface (reverse surface) side of the lead frame 31 having a smaller heat resistance is mounted on the side of the heat sink 36 having a higher heat capacity and higher heat transmission, thereby increasing the suppression effect of temperature increase.

FIG. 15 shows a cross-sectional view of the inverter drive unit of the semiconductor drive device 101, showing a mounting example of semiconductor modules 14c, 14d which are different from that of FIG. 14. In the semiconductor drive device 101 shown in FIG. 15, facing surfaces of the modules are opposite to those in FIG. 14. That is, the semiconductor modules 41c, 41d are respectively arranged so that the heat radiation surfaces 38a on the side of the bus bars 32 thermally contact two surfaces of one plate-shaped heat sink 37 which is vertically placed. On the heat radiation surfaces 38 on the side of the lead frames 31 of the semiconductor modules 41c, 41d, two separate heat sinks 36 are respectively arranged in the device.

The arrangement direction of the semiconductor modules 41 with respect to the axial direction of the device is not limited to the vertical direction but it is naturally possible to adopt horizontal mounting.

In the examples shown in FIG. 14 and FIG. 15, the structures in which the heat generators are arranged on both surfaces of one heat sink 36/37 are shown, however, it is also possible to adopt a structure (not shown) in which heat generators are arranged on outer surfaces of two heat sinks arranged to face each other and a gap portion is formed between the two heat sinks instead of arranging the heat generators on both surfaces of one heat sink, and four or more heat radiation surfaces can be secured also by the structure.

Embodiment 3

Next, Embodiment 3 will be explained below with reference to FIG. 16 to FIG. 19. A semiconductor drive device 102 according to Embodiment 3 shows an example in which two sets of three-phase inverters are mounted in the same manner as Embodiment 2 described above. Although the semiconductor modules 41c and 41d are molded so as to be separated in Embodiment 2, two sets of three-phase inverters are packed in an integral module in Embodiment 3. Only changed portions due to the above different points will be explained below, and explanation of the same components as the above is omitted here.

Figure 16:
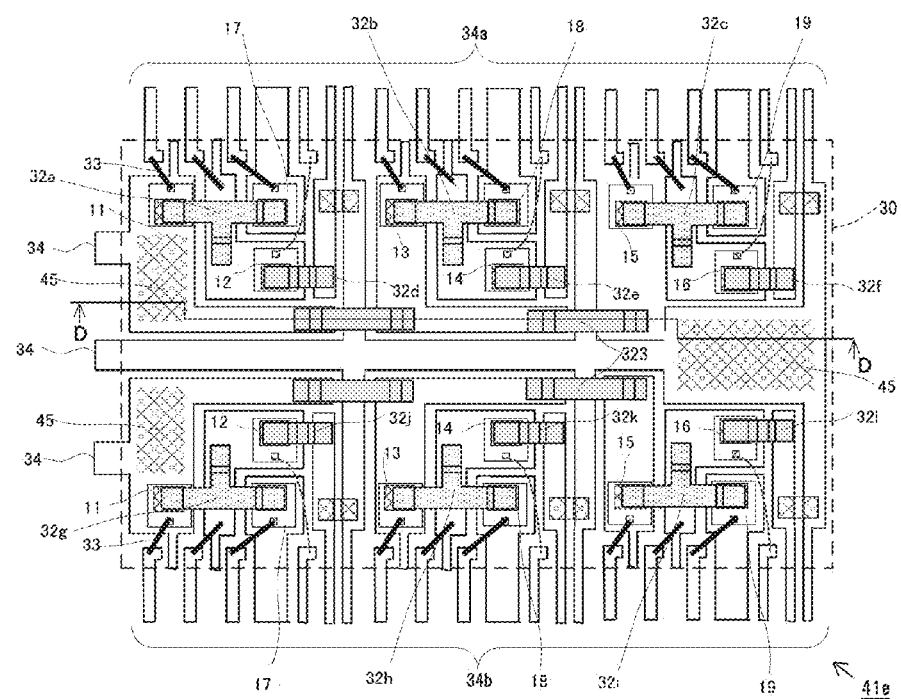
FIG. 16 is a plan view showing a semifinished state of a semiconductor module included in a semiconductor drive device according to Embodiment 3 of the present invention.
Figure 17:
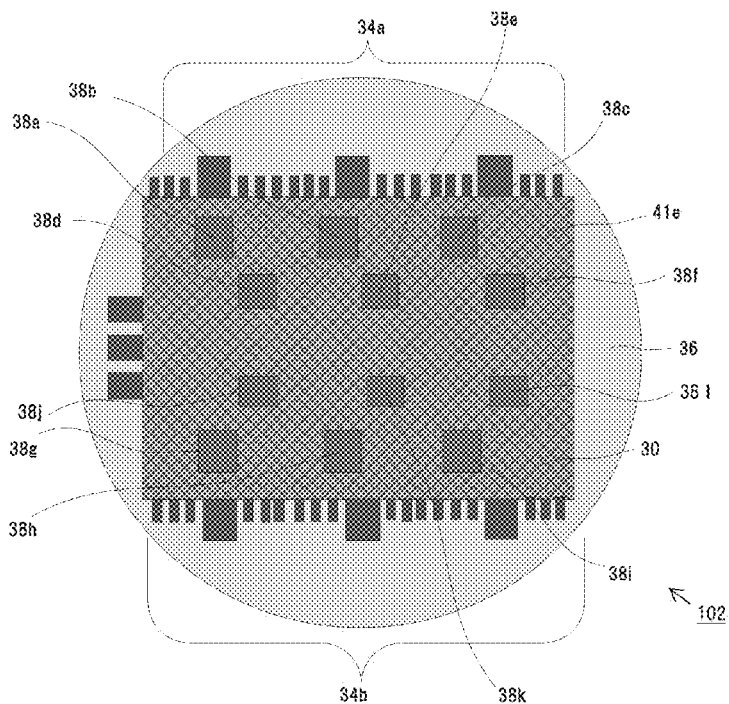
FIG. 17 is a plan view showing a relevant part of an inverter drive unit of the semiconductor drive device according to Embodiment 3.
Figure 18:
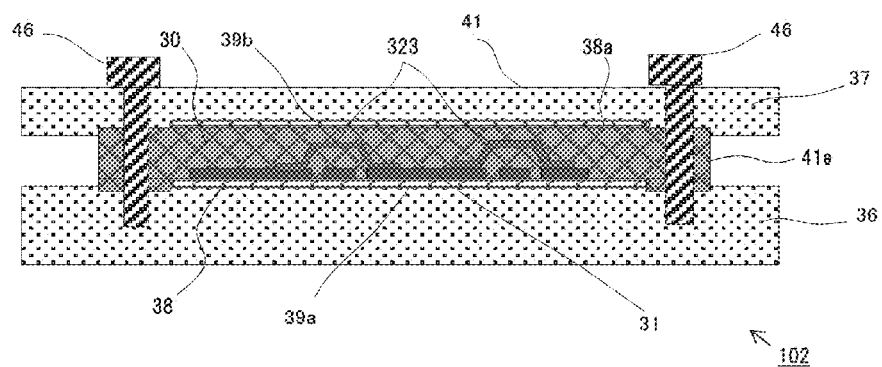
FIG. 18 is a cross-sectional view of a relevant part of the semiconductor drive device according to Embodiment 3.

FIG. 16 is a plan view showing a semifinished state of a semiconductor module 41e of the semiconductor drive device 102 according to Embodiment 3, which is a perspective view showing a relevant part, in which respective elements including bus bars 32a to 32l are integrally molded by the sealing resin 30. FIG. 17 is a plan view showing a relevant part of the inverter drive unit of the semiconductor drive device 102. FIG. 18 is a cross-sectional view of a relevant part of the semiconductor drive device 102.

As shown in FIG. 17, two sets of inverters 3 are modularized, thereby facilitating regulation in which heights of plural heat radiation surfaces 38a to 38l on the bus bars 32 are made to be uniform, and the heat radiation surfaces 38a to 38l can be exposed on the upper surface of the sealing resin 30 after the molding. Moreover, the switching elements 11 to 19 can be efficiently arranged on one plane while uniforming heat radiation amounts as shown in FIG. 16. The two pairs of inverters 3 are modularized as shown in FIG. 16, thereby sharing high-potential terminals of upper side FET and low-potential terminals of shunt resistors in the three-phase inverters in u, v and w phases, therefore, the area of a sharing terminal 45 can be taken wide.

As shown in a cross-sectional view (corresponding to D-D cross section of FIG. 16) of the semiconductor drive device 102 in a state where both heat radiation surfaces of the semiconductor module 41e are interposed between the heat sinks 36, 37 in FIG. 18, the sharing terminal 45 is effectively used, namely, screw hole portions are provided in the sharing terminal 45 inside the semiconductor module 41e, and two pairs of heat sinks 36, 37 and the semiconductor module 41e are co-fastened by screws 46. Accordingly, the heat sinks 36, 37 and the heat radiation surfaces 38, 38a are assembled in inner regions of the semiconductor module 41e, and regions other than the element forming regions of the module can be effectively used, therefore, structures of power supply bus bars or motor bus bars in the periphery of the power module can be simplified and the entire device can be reduced in size.

Embodiment 4

Next, Embodiment 4 will be explained below with reference to FIG. 19 to FIG. 21. Embodiment 4 is an example of a device in which two sets of three-phase inverters are mounted in the same manner as the above Embodiments 2, 3, which differs from the above Embodiments 1 to 3 in the structure of the power module. The switching elements (11 to 19) are mounted on two-layers of lead frames 31a, 31b, in which respective reverse surfaces are heat radiation surfaces 38 (two faces in total). Only changed portions due to the above different points will be explained below, and explanation of the same components as the above is omitted here.

Figure 19:
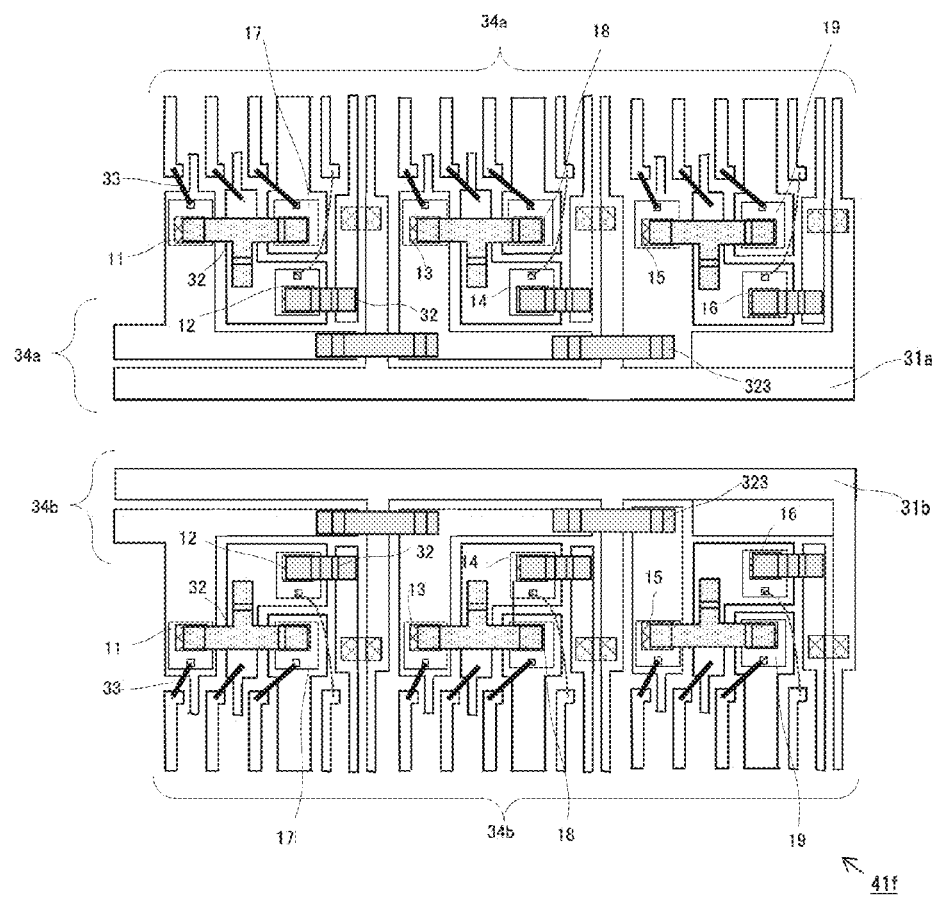
FIG. 19 is a plan view showing a semifinished state of a semiconductor module included in a semiconductor drive device according to Embodiment 4 of the present invention.
Figure 20:
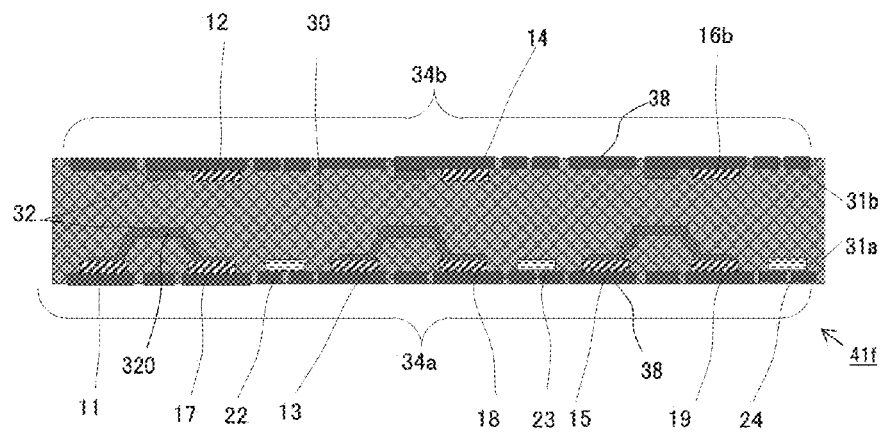
FIG. 20 is a cross-sectional view of a relevant part of the semiconductor module according to Embodiment 4.
Figure 21:
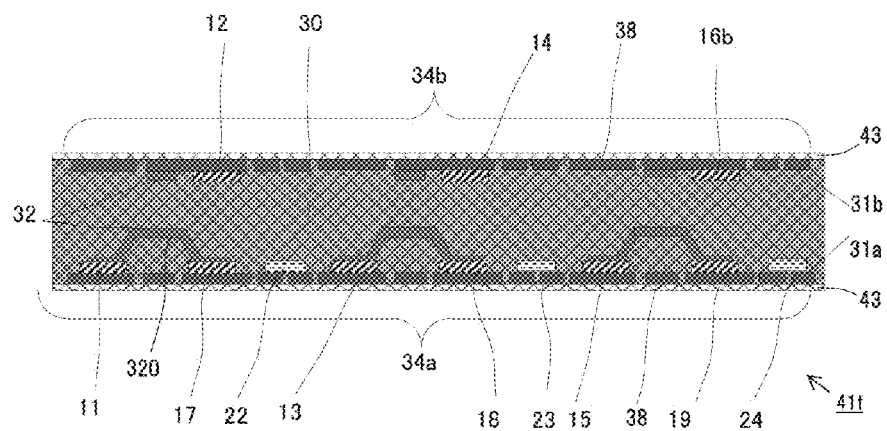
FIG. 21 is a cross-sectional view of a relevant part of the semiconductor module according to Embodiment 4.

A semiconductor module 41f according to Embodiment 4 is formed by molding the lead frames 31a, 31b on which the switching elements 11 to 19 are mounted as shown in FIG. 19 in an overlapping manner of two layers as shown in FIG. 20. The semiconductor module 41f has a structure in which structures in which elements are formed on the lead frames 31a, 31b are adhered in two layers so that element forming surfaces face inward through the sealing resin 30. A space between two-layers of lead frames 31a, 31b is sealed with the sealing resin 30 except the radiation surfaces of the lead frames, and reverse surfaces (outer layers) which are not element placing surfaces of respective lead frames 31a, 31b are used as heat radiation surfaces 38 respectively.

As the two-layers of lead frames 31a, 31b are three-dimensionally arranged, thereby expanding the area of mounting parts in the lead frames 31a, 31b and increasing the terminal area on which respective switching elements are mounted, which can reduce the heat resistance between the switching elements 11 to 19 and the heat radiation surfaces 38. Moreover, as the mounting area of parts is expanded, there is an advantage that respective elements are easily laid out.

The semiconductor module 41f according to Embodiment 4 has a structure in which two structures in which elements are formed on the lead frames 31a, 31b are sealed with the sealing resin 30 so that the element forming surfaces face inward. When the bus bars 32 having the flat surface portions 320 are formed on respective lead frames 31a, 31b, the flat surface portions 320 of the bus bars 32 face each other through the sealing resin 30. As heights of the flat surface portions 320 of the bus bars 32 are uniformed, there are advantages that the layout property is better than a case where heights of the bus bars 32 vary and that filling of mold resin can be easily performed in a manufacturing process.

Furthermore, it is possible to mold the reverse surfaces (lower surfaces) of the lead frames 31 with the highly heat-conductive resin 43 and form the entire heat radiation surfaces 38 to have the insulation structure in the same manner as the case of Embodiment 1. The insulation structure in which the highly heat-conductive resin 43 is disposed only on one face is shown in Embodiment 1, however, both heat radiation surfaces 38 can be insulated by adopting the structure of the semiconductor module having two-layers of lead frames 31 as in Embodiment 4. Accordingly, the insulation sheet is not necessary at the time of assembling the heat sink to the heat radiation surfaces, which simplifies processes and reduces costs. Heat sinks (not shown) are respectively arranged on the highly heat-conductive resins 43 positioned on upper and lower surfaces of the semiconductor module 41f shown in FIG. 21, thereby obtaining the semiconductor drive device.

In the present invention, respective embodiments may be combined freely and suitably modified and omitted within a scope of the invention.

The invention claimed is:

1. A semiconductor drive device comprising:
a semiconductor module comprising:
switching elements;
lead frames in which the switching elements are mounted on upper surfaces of the lead frames and heat radiation surfaces are formed on lower surfaces of the lead frames;
bus bars disposed on the lead frames, connecting between plural switching elements or between the lead frames and the switching elements and having flat surface portions on upper surfaces; and
a sealing resin for sealing the lead frames and the switching elements except heat radiation surfaces of the lead frames;
a heat sink contacting heat radiation surfaces of the lead frames included in the semiconductor modules while keeping an insulation property; and
a bus-bar side heat sink contacting upper surfaces of the flat surface portions of the bus bars of the semiconductor modules while keeping an insulation property,
wherein the heat radiation surfaces of the lead frames are arranged in one plane,
the switching elements are arranged between the heat radiation surfaces of the lead frames and upper surfaces of the flat surface portions of the bus bars, and
the heat sink has a higher heat capacity than the bus bar side heat sink.

2. The semiconductor drive device according to claim 1, wherein the upper surfaces of the flat surface portions of the plural bus bars are arranged on one plane.

3. The semiconductor drive device according to claim 1, wherein the upper surfaces of the flat surface portions of the bus bars and the heat radiation surfaces of the lead frames are arranged so as to be parallel to each other.

4. The semiconductor drive device according to claim 1, wherein the bus bars contact the switching elements or the lead frames at portions other than the flat surface portions.

5. The semiconductor drive device according to claim 1, wherein a thickness of wiring in the flat surface portions of the bus bars is thicker than other portions of the bus bars.

6. The semiconductor drive device according to claim 1, wherein a width of wiring in the flat surface portions of the bus bars is wider than other portions of the bus bars.

7. The semiconductor drive device according to claim 1, wherein the upper surfaces of the flat surface portions of the bus bars are heat radiation surfaces.

8. The semiconductor drive device according to claim 1, wherein two layers of lead frames are provided,
the two layers of lead frames are arranged so as to face each other so that the heat radiation surfaces of the lead frames are positioned on an outer layer side, and
a space between the two layers of lead frames is sealed with the sealing resin except the heat radiation surfaces of the lead frames.

9. The semiconductor drive device according to claim 1, wherein the semiconductor modules are mounted between the heat sink and the bus-bar side heat sink.

10. The semiconductor drive device according to claim 9, wherein the heat radiation surfaces of the lead frames of the semiconductor modules are arranged on one plane, and
the upper surfaces of the flat surface portions of the bus bars of the semiconductor modules are arranged on one plane which is parallel to the heat radiation surfaces of the lead frames.

11. The semiconductor drive device according to claim 1, wherein the semiconductor modules are respectively arranged on both surfaces of the heat sink having a flat-plate shape or outer surfaces of two heat sinks arranged to face each other.

12. The semiconductor drive device according to claim 1, wherein the semiconductor modules are respectively arranged on both surfaces of the bus-bar side heat sink having a flat-plate shape or outer surfaces of two bus-bar side heat sinks arranged to face each other.

13. The semiconductor drive device according to claim 1, wherein the heat sink and the bus-bar side heat sink are continuously coupled.

14. The semiconductor drive device according to claim 1, wherein a film made of a highly heat-conductive resin of 3 W/m·K or more is formed on the heat radiation surfaces on the lower surfaces of the lead frames.

15. The semiconductor drive device according to claim 1, wherein all the switching elements included in a multi-phase inverter of three phases or more are mounted inside one semiconductor module.

16. A semiconductor module comprising:
switching elements;
two layers of lead frames arranged so that inner surfaces of the lead frames face each other;
bus bars disposed on the lead frames, connecting between the switching elements, and having flat surface portions on upper surfaces of the switching elements; and
a sealing resin that is disposed between the inner surfaces of the lead frames, and seals the lead frames, the switching elements and the bus bars except heat radiation surfaces of the lead frames,
wherein the switching elements are mounted on the inner surfaces of the lead frames, and outer surfaces of the lead frames correspond to the heat radiation surfaces of the lead frames.

* * * * *